United States Patent [19]
Lin et al.

[11] Patent Number: 6,137,745
[45] Date of Patent: Oct. 24, 2000

[54] EMBEDDED MEMORY CONTROL CIRCUIT FOR CONTROL OF ACCESS OPERATIONS TO A MEMORY MODULE

[75] Inventors: Yu-Chang Lin, Hsinchu Hsien; Chuan-Jen Chang, Kaohsiung; Chen-Chi Chan, Hsinchu Hsien; Shih-Chih Chang, Taipei Hsien, all of Taiwan

[73] Assignee: Winbond Electronics Corp, Hsinchu, Taiwan

[21] Appl. No.: 09/322,078

[22] Filed: May 27, 1999

[30] Foreign Application Priority Data

May 21, 1999 [TW] Taiwan ................... 88208240

[51] Int. Cl.$^7$ .................................................. G11C 8/00
[52] U.S. Cl. ....................... 365/230.03; 365/200
[58] Field of Search ........................ 365/200, 230.03, 365/230.06, 230.08, 210, 201, 189.05

[56] References Cited

U.S. PATENT DOCUMENTS

| | | | |
|---|---|---|---|
| 5,398,206 | 3/1995 | Akizawa et al. | 365/200 |
| 5,528,539 | 6/1996 | Ong et al. | 365/200 |

Primary Examiner—David Nelms
Assistant Examiner—David Lam
Attorney, Agent, or Firm—J. C. Patents; Jiawei Huang

[57] ABSTRACT

An embedded memory control circuit is provided for use with a memory module consisting of a number of partly-defective memory chips to allow these partly-defective memory chips to be combined for use as a single memory unit with the same address space of each nondefective memory chip. The embedded memory control circuit includes a bank-select unit, a bank-suppress unit, and a data output buffer. The bank-select unit is capable of detecting whether each of the banks in the memory module is defective or nondefective to thereby generate a plurality of corresponding bank-status signals each indicative of whether the corresponding bank is defective or nondefective. The bank-suppress unit is capable of, in response to the bank-status signals and the bank-select signal, generating a plurality of defective-bank suppressing signals which can suppress each defective bank in the memory module, if any. The data output buffer is capable of, in response to the defective-bank suppressing signals from the bank-suppress unit, performing an access operation to the memory module with all the defective banks, if any, being suppressed by the defective-bank suppressing signals.

6 Claims, 6 Drawing Sheets

EMBEDDED MEMORY CONTROL CIRCUIT FOR CONTROL OF ACCESS OPERATIONS TO A MEMORY MODULE

CROSS-REFERENCE TO RELATED APPLICATION

This application claims the priority benefit of Taiwan Application serial no. 88208240, filed May 21, 1999, the full disclosure of which is incorporated herein by reference.

BACKGROUND OF THE INVENTION

1. Field of the Invention

This invention relates to computer memory technology, and more particularly, to an embedded memory control circuit for use in conjunction with a memory module consisting of two or more memory chips for the purpose of suppressing the defective banks in the memory module, if any, and combining the nondefective banks into a single memory unit.

2. Description of Related Art

In the manufacture of computer memory devices, the manufactured memory circuitry may contain defective parts that would be unusable for data storage. A conventional solution to this problem is to provide redundant circuitry that can be utilized as substitute for the defective parts of the manufactured memory device, thereby making the overall memory device nevertheless usable for data storage. One drawback to this solution, however, is that when the defective part of a memory device is more than the redundant circuitry can substitute, the memory device is unusable and therefore should be discarded, resulting in a low yield rate and an increase in the overall manufacture cost.

Still one solution to the above-mentioned problem is to use a complementary set of memory chips in such a manner that one defective bank in one memory chip can be functionally replaced by one nondefective bank in another memory chip. A realization of this solution is to use a so-called ASIC (Application-Specific Integrated Circuit) controller in conjunction with a number of partly-defective memory chips, so that the nondefective banks in these memory chips can be combined as a single memory unit. One drawback to this solution, however, is that it would cause a considerable signal delay; and this signal delay would cause erroneous data when the ASIC controller is used in a high-speed environment. Moreover, the incorporation of the ASIC controller in the memory module would require a new design to the layout of the memory module, and therefore would result in an increase in the overall manufacture cost. The use of the ASIC controller is therefore undesired.

SUMMARY OF THE INVENTION

This invention provides an embedded memory control circuit for use with a memory module consisting of a number of partly-defective memory chips to allow the defective memory chips to be used as a single memory unit with the same address space and access speed of each nondefective memory chip.

This invention provides an embedded memory control circuit for use with a memory module consisting of a number of partly-defective memory chips, which can suppress the defective banks in the memory module to thereby allow the access operation to be directed only to the nondefective banks in the memory module so that power consumption by the memory chips can be reduced.

This invention provides a memory module with an embedded memory control circuit, which allows the incorporation of the embedded memory control circuit into the memory module without having to redesign a new circuit layout for the memory module and also allows no signal delay and a low power consumption.

In accordance with the foregoing and other objectives of this invention, an embedded memory control circuit is provided for use with a memory module. The embedded memory control circuit comprises a bank-select unit, a bank-suppress unit and a data output buffer. The bank-select unit is capable of detecting whether each of the banks in the memory module is defective or nondefective to generate a plurality of corresponding bank-status signals. The bank-suppress unit is used for generating a plurality of defective-bank suppressing signals which can suppress each defective bank in the memory module, if any. The data output buffer is used for performing an access operation to the memory module with all the defective banks. The invention can suppress the defective banks from being accessible and combine the nondefective banks into a single memory unit. Since the access operation to defective banks is disabled, it would allow a reduction in the overall power consumption by the memory module.

The invention provides an embedded memory control circuit for use on a memory module. The embedded memory control circuit of the invention comprises a bank-select unit, a bank-suppress unit, a bank-active unit and a data output buffer. The bank-select unit is capable of detecting whether each of the banks in the memory module is defective or nondefective. The bank-suppress unit is used for generating a plurality of defective-bank suppressing signals which can suppress each defective bank in the memory module, if any. The bank-active unit is used for generating a plurality of bank-activation signals which cause the word-line driving circuit to act in response to the current request. The data output buffer is used for performing an access operation to the memory module with all the defective banks, if any, being suppressed by the defective-bank suppressing signals. The embedded incorporation of the invention in the memory module requires only a small layout space in the memory module, in which a circuit layout of the memory module requires few modification. The invention also possesses advantages of no signal delay and a low power consumption.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides an embedded memory control circuit which can be embedded in a memory module consisting of a number of partly-defective memory chips to allow these partly-defective memory chips to be used as a single memory unit with the same address space and access speed of each nondefective memory chip. The embedded incorporation of the invention in the memory module requires only a small layout space in the memory module, in which a circuit layout of the memory module requires few modification. The invention also possesses advantages of no signal delay and a low power consumption. The invention utilizes the bonding-option means and fuse-option means in the memory chips to provide bank-select signals for access operation. In the case the bonding-option means is used, it can be either bonded to the logic-high voltage VCC or the logic-low voltage VSS to allow each bonding pad to provide either a logic-high voltage or a logic-low voltage; and whereas, in the case the fuse-option means is used, each fuse can be used to provide either a logic-high voltage or a logic-low voltage by either blowing the fuse or not. The use of the bonding-option means or the fuse-option means allows the respective defective banks in a number of memory chips to be combined for use as a single memory unit with the same address space and access speed of each nondefective memory chip. The invention also allows the access operation to be directed only to the nondefective banks in the memory module so that power consumption by the memory chips can be reduced.

In the case the bonding-option means is used, the defective banks and nondefective banks can be specified during the packaging. When the fuse-option means is used, the defective banks and nondefective banks can be specified through the use of signature fuse obtained from the voltage/current characteristics at specific pins on the chip.

Figure 1:
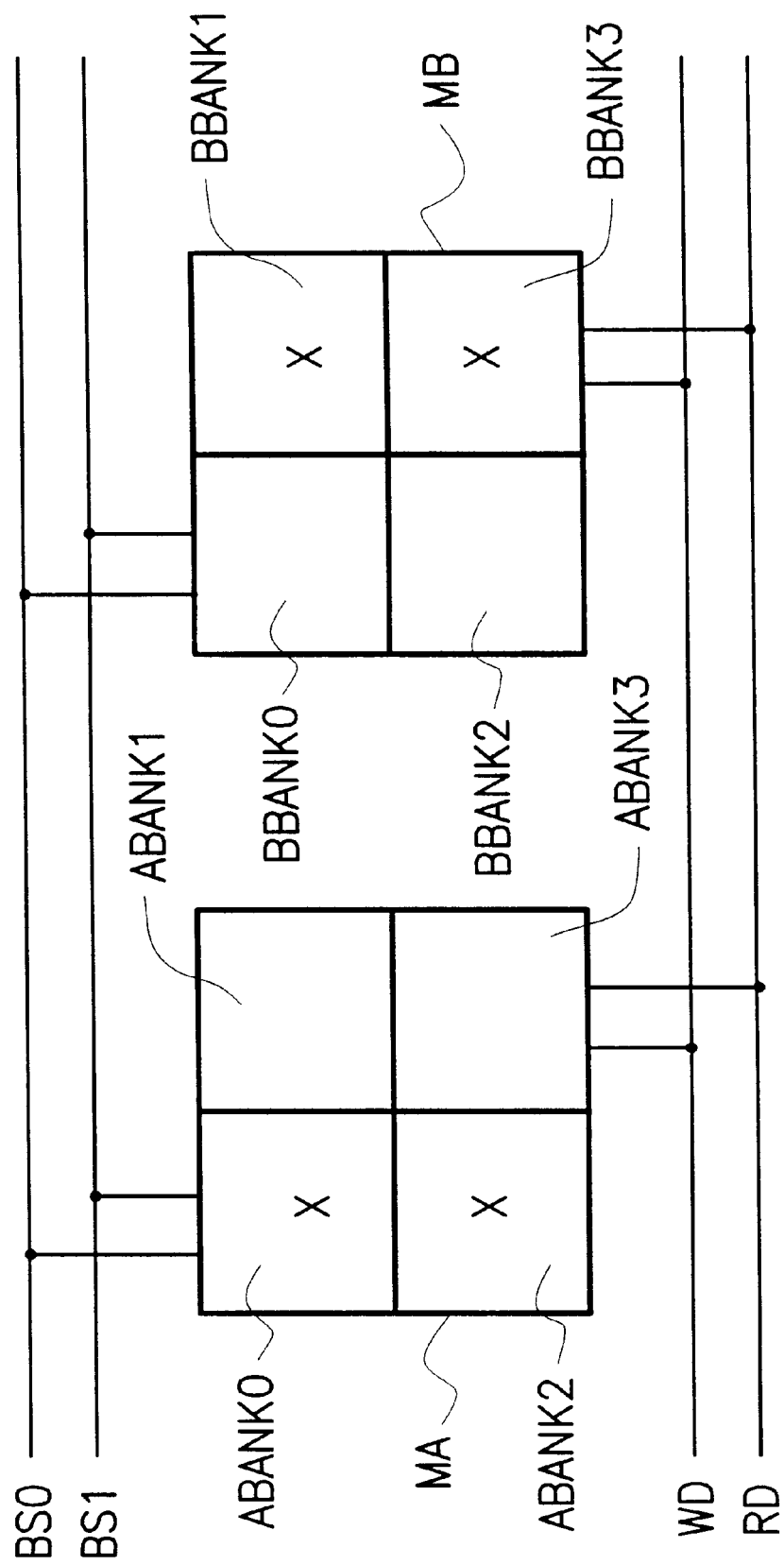
FIG. 1 is a schematic diagram of a memory module consisting of two partly-defective memory chips on which the embedded memory control circuit of the invention is utilized.

FIG. 1 is a schematic diagram of a memory module consisting of two partly-defective memory chips MA, MB on which the embedded memory control circuit of the invention (shown in FIG. 2) is utilized. The first memory chip MA is partitioned into four banks ABANK0, ABANK1, ABANK2, and ABANK3; and similarly, the second memory chip MB is partitioned into four banks BBANK0, BBANK1, BBANK2, and BBANK3. Assume the first memory chip MA has two defective banks ABANK0 and ABANK2; while the second memory chip MB also has two defective banks BBANK1 and BBANK3 (each defective bank is indicated by the cross mark "x" in FIG. 1). A pair of bank-select signals BS0, BS1 are used to select a specific bank in the memory module for access operation. In write operation, the data are written via a write-data line WD into the selected bank; and whereas in read operation, the retrieved data are outputted from a read-data line RD.

Figure 2:
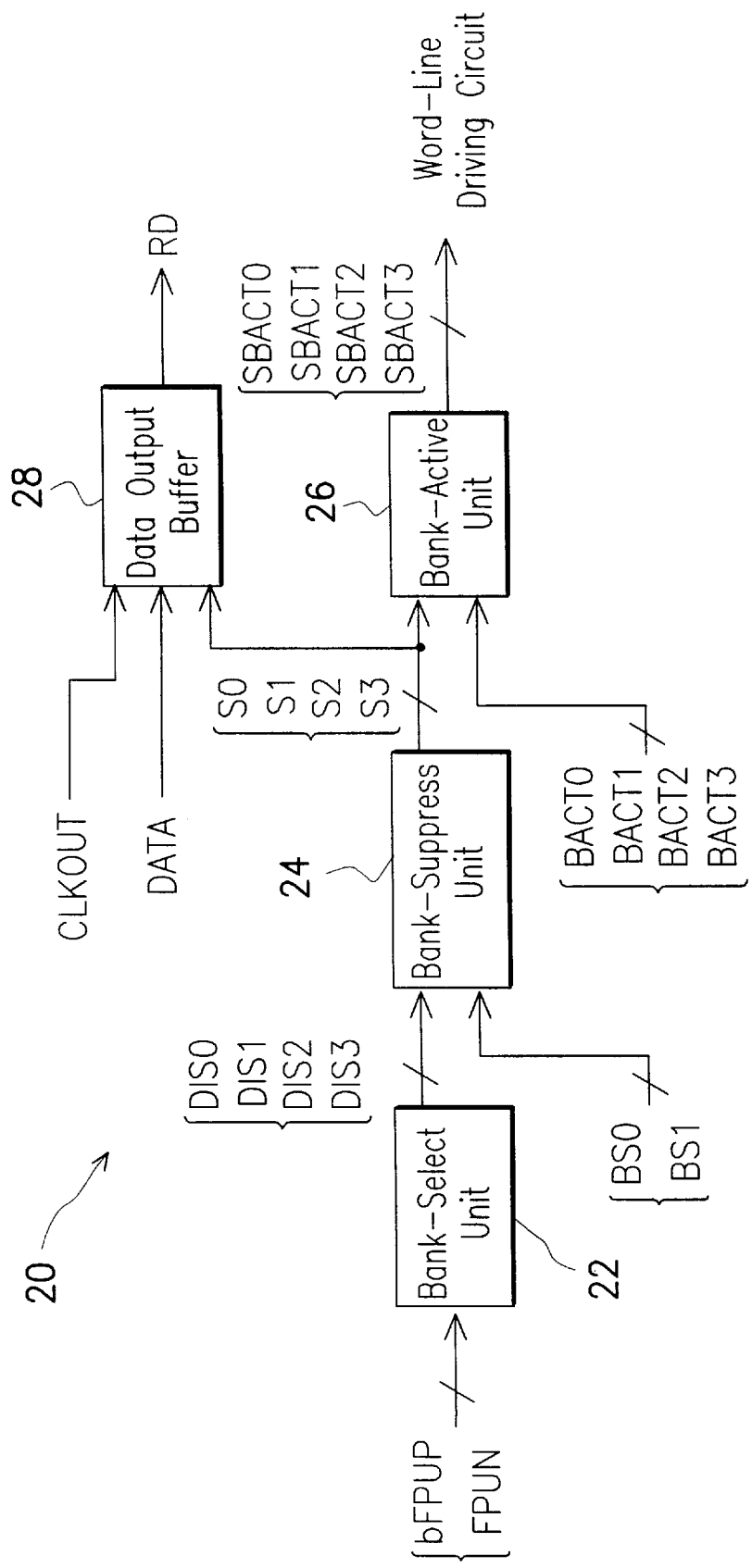
FIG. 2 is a schematic block diagram of the embedded memory control circuit according to the invention.

FIG. 2 is a schematic block diagram of the embedded memory control circuit according to the invention (designated by the reference numeral 20). As shown, the embedded memory control circuit 20 includes a bank-select unit 22, a bank-suppress unit 24, a bank-active unit 26, and a data output buffer 28. The bank-select unit 22 has an input side taking two initialization signals bPFUP and FPUN as input signals and an output side for outputting a set of bank-status signals DIS0, DIS1, DIS2, and DIS3 indicative of whether each of the banks in the memory module is nondefective or defective. The bank-suppress unit 24 is capable of generating a set of defective-bank suppressing signals (S0, S1, S2, S3) in response to the bank-status signals (DIS0, DIS1, DIS2, DIS3) from the bank-select unit 22 and the bank-select signals (BS0, BS1) from the requesting circuit (not shown). These defective-bank suppressing signals (S0, S1, S2, S3) are each used to suppress the corresponding one of the defective banks in the memory module during access operation. The bank-active unit 26 is capable of generating a set of bank-active suppressing signals (SBACT0, SBACT1, SBACT2, SBACT3) in response to the defective-bank suppressing signals (S0, S1, S2, S3) from the bank-select unit 22 and a plurality of bank-active signals (BACT0), BACT1, BACT2, BACT3) from the requesting circuit (not shown). These bank-active suppressing signals (SBACT0, SBACT1, SBACT2, SBACT3) are used to deactivate the associated word lines of the defective banks so as to reduce overall power consumption during access operation. The data output buffer 28 is coupled to the memory module and is capable of outputting the requested data from the nondefective banks, with the defective banks being suppressed by the defective-bank suppressing signals (S0, S1, S2, S3). If the selected bank is defective, the corresponding one of the defective-bank suppressing signals will cause the clock signal CLKOUT to be deactivated, thereby setting the read-data line RD of the data output buffer 28 at a high-impedance state (Hi-Z); and otherwise, the read-data line RD is connected to the DATA line to output the requested data from the selected bank.

Detailed inside structures of the bank-select unit 22, the bank-suppress unit 24, the bank-active unit 26, and the data output buffer 28 are depicted in the following with reference to FIG. 3, FIG. 4, FIG. 5, and FIG. 6, respectively.

Figure 3:
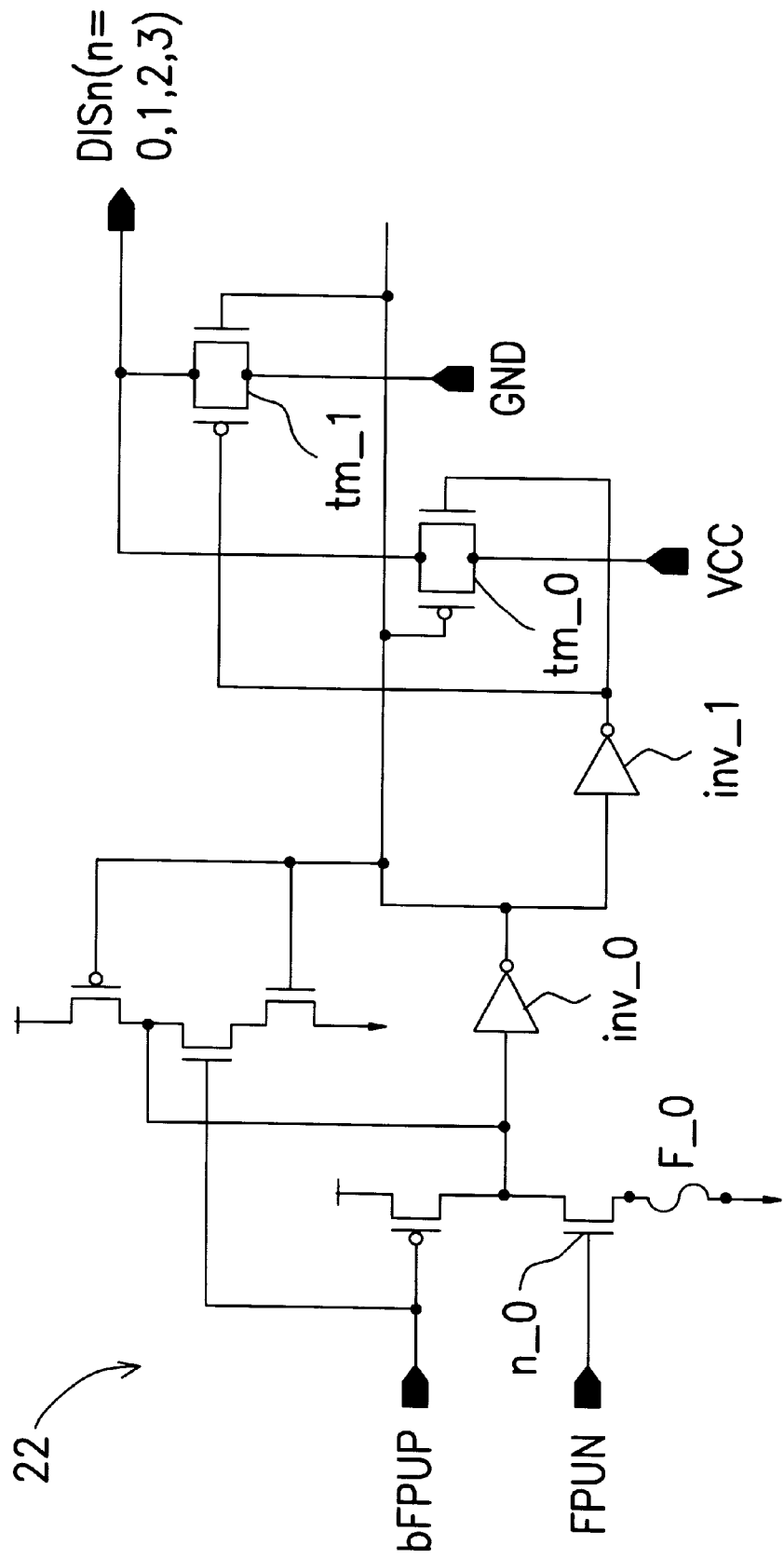
FIG. 3 is a schematic diagram showing detailed inside circuit structure of the bank-select unit utilized in the embedded memory control circuit of FIG. 2.
Figure 7:
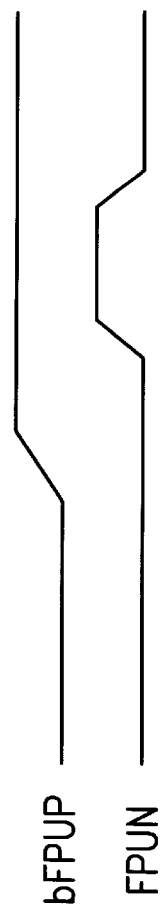
FIG. 7 is a signal waveform diagram, showing the waveform and sequencing of two initialization signals that are input to the bank-select unit of FIG. 3.

FIG. 3 is a schematic diagram showing detailed inside circuit structure of the bank-select unit 22 utilized in the embedded memory control circuit of FIG. 2. In accordance with the invention, each of the banks in the memory module is associated with one such bank-select unit 22 shown in FIG. 3. In the case of FIG. 1, for example, four bank-select units 22 are provided respectively for the four banks in each memory chip. When a certain bank is defective, its associated fuse F_0 is broken (electrically disconnected). At the initialization, the waveforms of the initialization signals bFPUP and FPUN input to the bank-select unit 22 are illustrated in FIG. 7. This causes the output signal DISn (n=0, 1, 2, or 3) to be set to a low-voltage logic stage (LOW) if the fuse F_0 is unbroken, and otherwise a high-voltage logic state (HIGH) if the fuse F_0 is broken. Therefore, if DISn (n=0, 1, 2, or 3)=LOW, it indicates that the associated bank in the memory module is defective.

Figure 4:
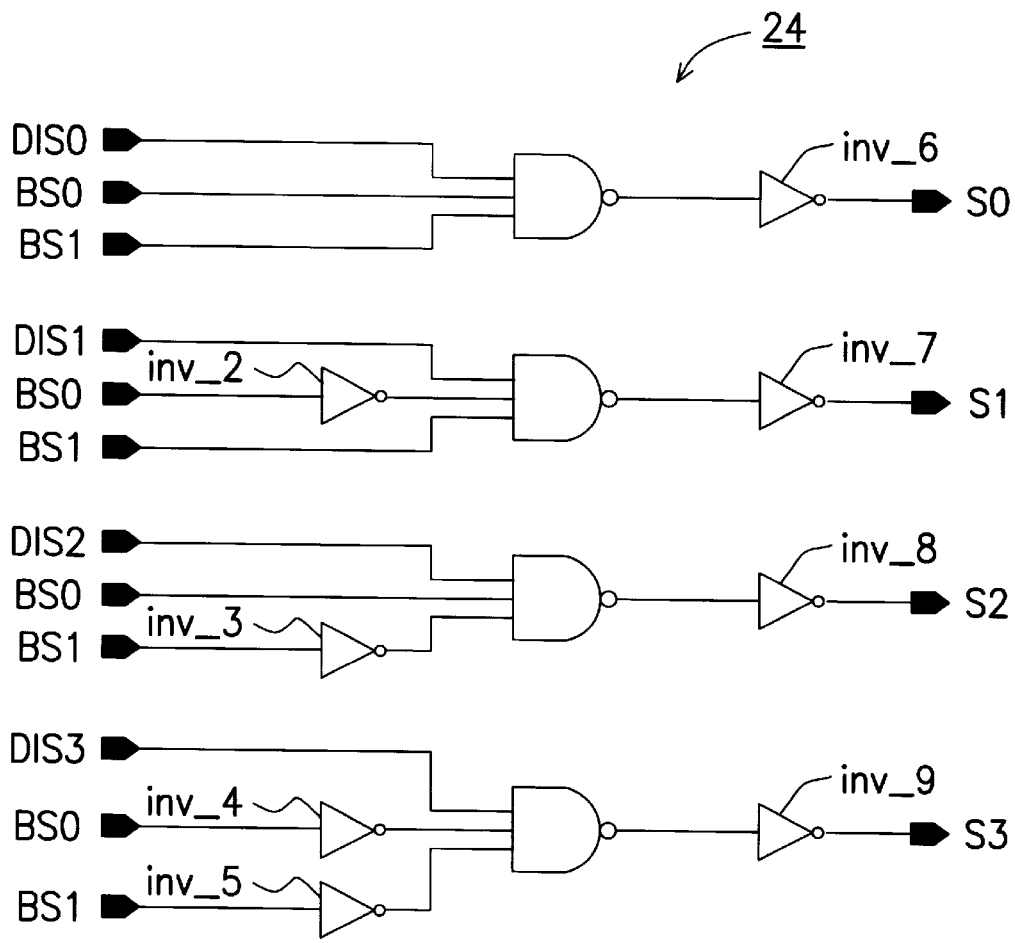
FIG. 4 is a schematic diagram showing detailed inside circuit structure of the bank-suppress unit utilized in the embedded memory control circuit of FIG. 2.
Figures 8, 9:
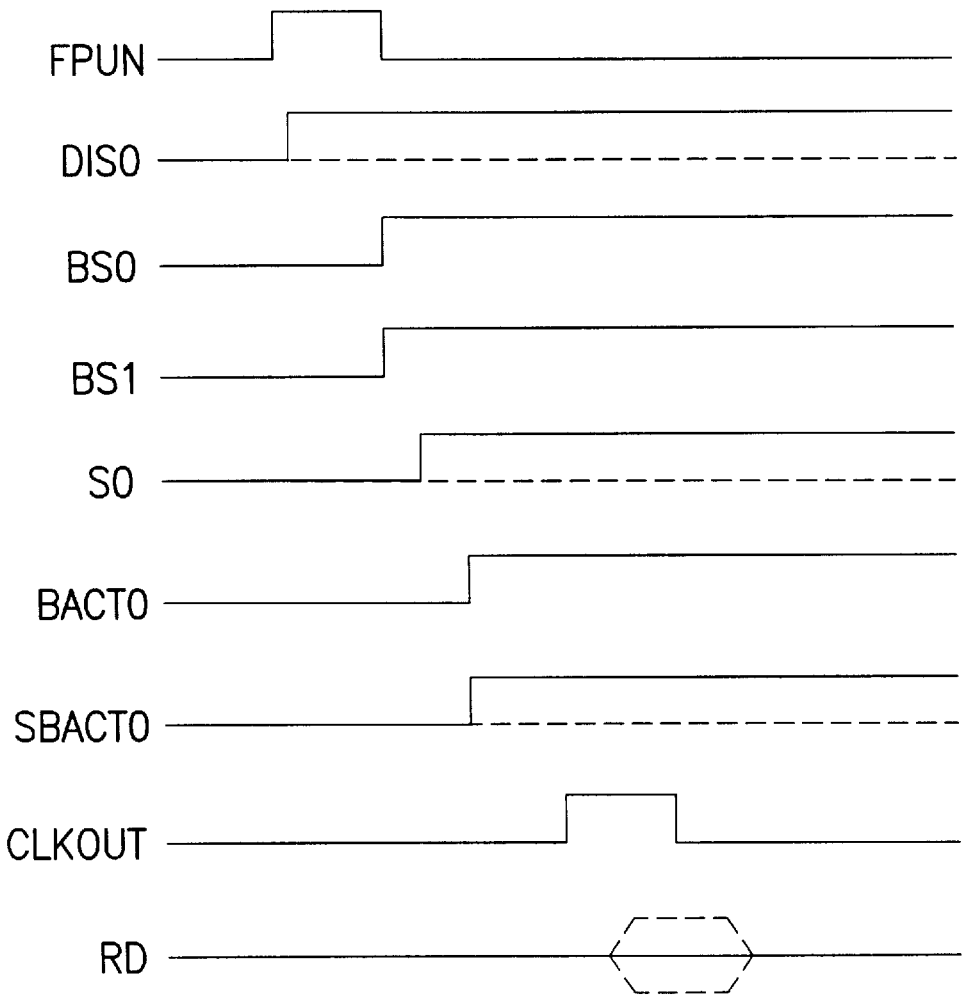
FIG. 8 is a table, showing the logic states of the bank-select signals (BS0, BS1) and the correspondingly accessed banks in the memory module of FIG. 1.
FIG. 9 is a signal waveform diagram, showing the waveform and sequencing of a plurality of signals used by the embedded memory control circuit of the invention.

FIG. 4 is a schematic diagram showing detailed inside circuit structure of the bank-suppress unit 24 utilized in the embedded memory control circuit of FIG. 2. Assume DIS0= HIGH, then in the case of (BS0, BS1)=(HIGH, HIGH), it will cause the output S0=HIGH, indicating that the corresponding bank in the memory module is defective. FIG. 8 shows the logic states of the bank-select signals (BS0, BS1) and the correspondingly accessed banks in the memory module shown in FIG. 1. From this table, for example, it can be seen that when (BS0, BS1)=(HIGH, HIGH), it indicates that the banks ABANK0 and the BBANK0 are to be accessed.

Figure 5:
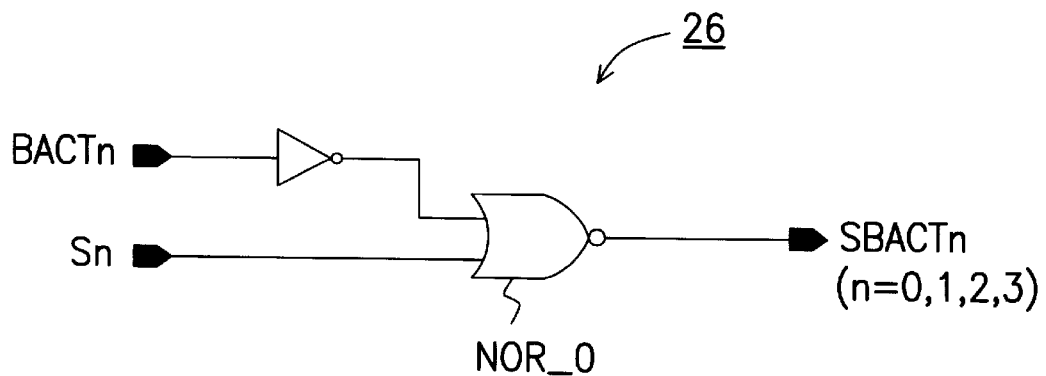
FIG. 5 is a schematic diagram showing detailed inside circuit structure of the bank-active unit utilized in the embedded memory control circuit of FIG. 2.

FIG. 5 is a schematic diagram showing detailed inside circuit structure of the bank-active unit 26 utilized in the embedded memory control circuit of FIG. 2. In accordance with the invention, each of the banks in the memory module is associated with one such bank-active unit 26 shown in FIG. 5. In the case of FIG. 1, for example, four bank-active unit 26 are provided respectively in association with the four banks in each memory chip. The circuit of FIG. 5 is designed to perform a specified logic operation on the each paired set of one bank-active signal BACTn (n=0, 1, 2, 3) and the corresponding defective-bank suppressing signal Sn (n=0, 1, 2, 3) to thereby obtain a bank-active suppressing signal SBACTn (n=0, 1, 2, 3). For the bank ABANK0 in the first memory chip MA (n=0), which is a defective bank, it causes S0=HIGH; therefore, when it is intended to gain access to this defective bank ABANK0 (the BBANK0 in the second memory chip MB will be selected concurrently), the corresponding bank-activation signal BACT0 is set to HIGH. At this time, since S0=HIGH, the circuit of FIG. 5 will cause SBACT0=LOW; and the condition of SBACT0=LOW will then cause the word-line driving unit coupled to the memory module to be deactivated, thereby causing the bank ABANK0 to be inaccessible. On the other hand, for the bank BBANK0 in the second memory chip MB, which is a nondefective bank, it causes S0=LOW, and therefore SBACT0=HIGH. The condition of SBACT0=HIGH will allow the bank BBANK0 to be accessible. Fundamentally, the bank-active unit 26 operates in such a manner that when the requested bank is a defective one, it will cause the word lines connected to the defective bank to be deactivated during the access operation, thereby allowing these word lines to consume no power during the access operation. The overall power consumption required for the memory access operation is therefore reduced.

Figure 6:
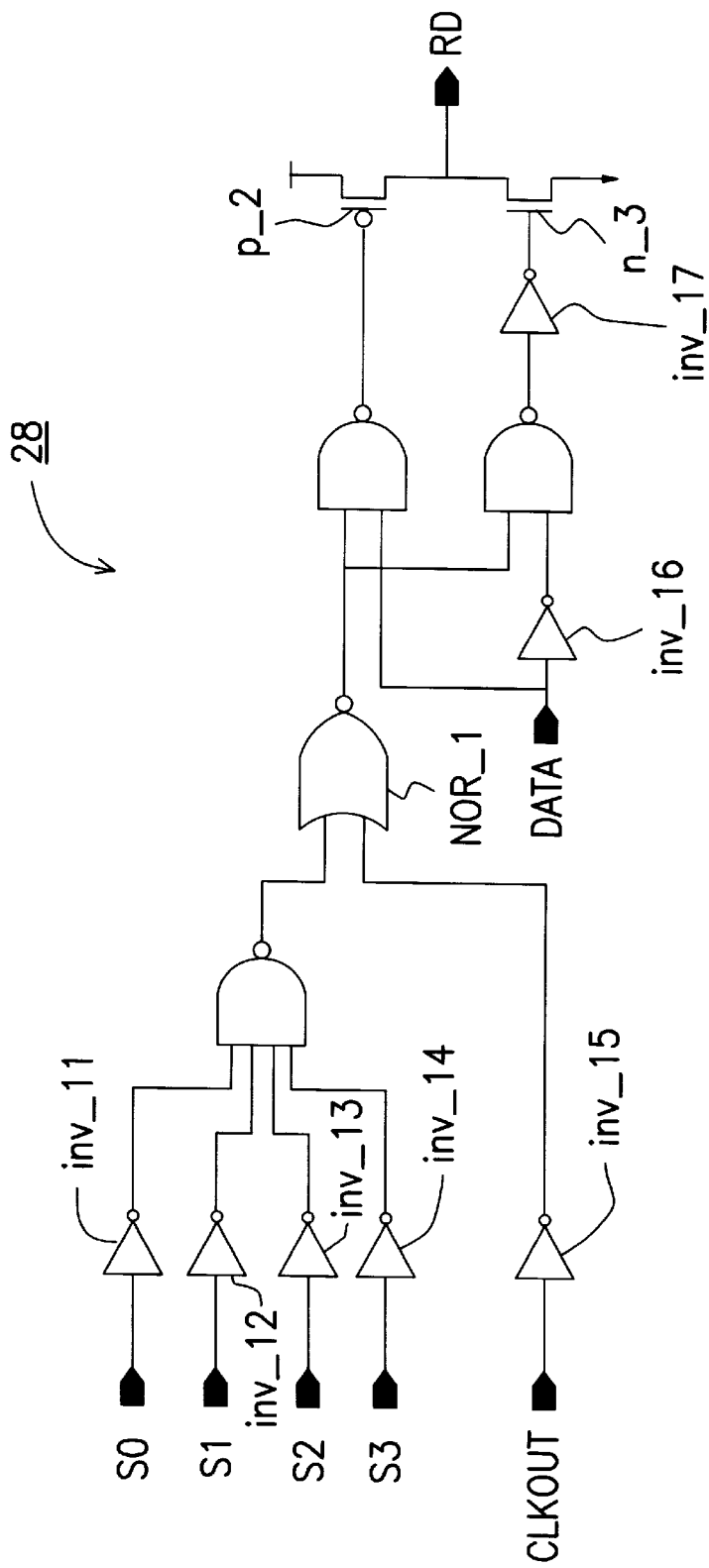
FIG. 6 is a schematic diagram showing detailed inside circuit structure of the data output buffer utilized in the embedded memory control circuit of FIG. 2.

FIG. 6 is a schematic diagram showing detailed inside circuit structure of the data output buffer 28 utilized in the embedded memory control circuit of FIG. 2. As shown, the data output buffer 28 responds to the defective-bank suppressing signals (S0, S1, S2, S3) to determine whether the data on the DATA line are to be output from the read-data line RD or not. Fundamentally, the data on the DATA line can be output from the read-data line RD only when the clock signal CLKOUT is switched to HIGH. When S0=HIGH (indicating that the associated bank is defective), it will cause the read-data line RD to be set at a high-impedance (HI-Z) state, thereby inhibiting the data on the DATA line from outputting from the read-data line RD. On the other hand, when any one of S0, S1, S2, S3 is LOW, it indicates that a nondefective bank is being accessed, it will cause the read-data line RD to be connected to the DATA line so as to allow the data on the DATA line to be outputted from the read-data line RD. Therefore, only the data in the nondefective bank will be retrieved, and the data in the defective bank will be suppressed.

In the case of writing data into the memory module, since the word lines connected to the defective banks are all deactivated by the bank-active unit 26, the data will be written only into the nondefective banks. For instance, if (BS0, BS1)=(HIGH, HIGH) during write operation, the embedded memory control circuit of the invention will write the data only into the nondefective bank BBANK0 and not into the defective bank ABANK0. On the other hand, if (BS0, BS1)=(HIGH, HIGH) during read operation, the embedded memory control circuit of the invention will read data only from the nondefective bank BBANK0 and not from the defective bank ABANK0.

FIG. 9 is a signal waveform diagram, showing the waveforms and timings of the various signals FPUN, DIS0, BS0, BS1, S0, BACT0, SBACT0, CLKOUT, and RD used by the embedded memory control circuit of the invention. In FIG. 9, the solid lines represent the signal waveforms in the case of the requested bank being a defective one, and dashed lines represent the signal waveforms in the case of the requested bank being a nondefective one. By the embedded memory control circuit of the invention, only the nondefective banks in the memory module can be accessed, while the defective banks are suppressed from access.

In conclusion, the invention provides an embedded memory control circuit which can be used in conjunction with a memory module of two or more memory chips with defective banks for the purpose of suppressing the defective banks from being accessible and combining the nondefective banks into a single memory unit. Since the access operation to defective banks is disabled, it would allow a reduction in the overall power consumption by the memory module. Moreover, if all the memory banks in the memory module are nondefective, the embedded memory control circuit of the invention can nevertheless utilize the full data storage capacity of the memory module.

The embedded memory control circuit of the invention has the following advantages.

First, in the foregoing preferred embodiment, the embedded memory control circuit is utilized in conjunction with a memory module of two memory chips. However, the number of memory chips is not limited to two, and can be three or more. Broadly speaking, the embedded memory control circuit of the invention can be utilized in conjunction with a memory module of two or more memory chips for the purpose of suppressing the defective banks from being accessible and combining the nondefective banks into a single memory unit.

Second, the embedded memory control circuit of the invention can utilize either bonding-option means or fuse-option means to provide bank-select signals for access operation.

Third, the embedded memory control circuit of the invention can deactivate the word-line driving circuit connected to the defective banks so that the associated word lines will not be put into activated states during the access operation, and thus will not consume power during the access operation. The overall power consumption can therefore be reduced. The use of the bank-active unit 26, however, is optional.

Fourth, during read operation, the embedded memory control circuit of the invention can suppress the clock signal so that the read-data line is set to a Hi-Z state, allowing no data to be read therefrom.

Fifth, during write operation, the embedded memory control circuit of the invention can prevent the data from being written into the defective banks without having to deactivate the word-line driving unit.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An embedded memory control circuit for use on a memory module of a plurality of memory chips partitioned into a plurality of banks of which one or more might be defective for the purpose of controlling the access operation to the memory module; the access operation utilizing a plurality of bank-select signals to select requested banks and a plurality of word-line driving signals to drive a word-line driving unit coupled to the memory module;

the embedded memory control circuit comprising:

a bank-select unit which is capable of detecting whether each of the banks in the memory module is defective or nondefective to thereby generate a plurality of corresponding bank-status signals each indicative of whether the corresponding bank is defective or nondefective;

a bank-suppress unit, responsive to the bank-status signals and the bank-select signal, for generating a plurality of defective-bank suppressing signals which can suppress each defective bank in the memory module, if any;

a bank-active unit, responsive to the defective-bank suppressing signals from the bank-suppress unit and the word-line driving signals, for generating a plurality of bank-activation suppressing signals which cause the word-line driving circuit to act in response to the current request; and a data output buffer, responsive to the defective-bank suppressing signals from the bank-suppress unit, for performing an access operation to the memory module with all the defective banks, if any, being suppressed by the defective-bank suppressing signals.

2. The embedded memory control circuit of claim 1, wherein the data output buffer is driven by a clock signal.

3. An embedded memory control circuit which is embedded in a memory module of a plurality of memory chips partitioned into a plurality of banks of which one or more might be defective for the purpose of controlling the access operation to the memory module; the access operation utilizing a plurality of bank-select signals to select requested banks and a plurality of word-line driving signals to drive a word-line driving unit coupled to the memory module;

the embedded memory control circuit comprising:

a bank-select unit which is capable of detecting whether the banks in the memory module are defective or nondefective to thereby generate a plurality of corresponding bank-status signals each indicative of whether the corresponding bank is defective or nondefective;

a bank-suppress unit, responsive to the bank-status signals and the bank-select signal, for generating a plurality of defective-bank suppressing signals which can suppress each defective bank in the memory module, if any;

a bank-active unit, responsive to the defective-bank suppressing signals from the bank-suppress unit and the word-line driving signals, for generating a plurality of bank-activation suppressing signals which cause the word-line driving circuit to act in response to the current request; and a data output buffer, responsive to the defective-bank suppressing signals from the bank-suppress unit, for performing an access operation to the memory module with all the defective banks, if any, being suppressed by the defective-bank suppressing signals.

4. An embedded memory control circuit for use on a memory module of a plurality of memory chips in such a manner as to be embedded in one of the memory chips of the memory module for the purpose of controlling the access operation to the memory module, the memory chips being each partitioned into a plurality of banks of which one or more might be defective and sharing a common set of write-data lines, read-data lines, and bank-select signals, with the access operation utilizing a plurality of bank-select signals to select requested banks and a plurality of word-line driving signals to drive a word-line driving unit coupled to the memory module;

the embedded memory control circuit comprising:

a bank-select unit which is capable of detecting whether the banks in the memory module are defective or nondefective to thereby generate a plurality of corresponding bank-status signals each indicative of whether the corresponding bank is defective or nondefective;

a bank-suppress unit, responsive to the bank-status signals and the bank-select signal, for generating a plurality of defective-bank suppressing signals which can suppress the defective bank in the memory module, if any;

a bank-active unit, responsive to the defective-bank suppressing signals from the bank-suppress unit and the word-line driving signals, for generating a plurality of bank-activation suppressing signals which cause the word-line driving circuit to act in response to the current request; and a data output buffer, responsive to the defective-bank suppressing signals from the bank-suppress unit, for performing an access operation to the memory module with all the defective banks, if any, being suppressed by the defective-bank suppressing signals.

5. A memory module, which comprises:

a plurality of memory chips which are partitioned into a plurality of banks of which one or more might be defective and share a common set of write-data lines, read-data lines, and bank-select signals, with the access operation utilizing a plurality of bank-select signals to select requested banks; and an embedded memory control circuit which is embedded in at least one of the memory chips for controlling the access operation to the memory chips; the embedded memory control circuit including:

a bank-select unit which is capable of detecting whether the banks in the memory module are defective or nondefective to thereby generate a plurality of corresponding bank-status signals indicative of whether the corresponding bank is defective or nondefective;

a bank-suppress unit, responsive to the bank-status signals and the bank-select signal, for generating a plurality of defective-bank suppressing signals which can suppress the defective bank in the memory module, if any; and a data output buffer, responsive to the defective-bank suppressing signals from the bank-suppress unit, for performing an access operation to the memory module with all the defective banks, if any, being suppressed by the defective-bank suppressing signals.

6. The memory module of claim 5, further comprising:

a bank-active unit, responsive to the defective-bank suppressing signals from the bank-suppress unit and the word-line driving signals, for generating a plurality of bank-activation suppressing signals which cause the word-line driving circuit to act in response to the current request.

* * * * *